(12) United States Patent
Hwang et al.

(10) Patent No.: US 12,326,753 B2
(45) Date of Patent: Jun. 10, 2025

(54) SEMICONDUCTOR DEVICES AND SEMICONDUCTOR SYSTEMS RELATED TO SYNCHRONIZATION BETWEEN CLOCKS

(71) Applicant: SK hynix Inc., Icheon-si (KR)

(72) Inventors: Kyu Dong Hwang, Icheon-si (KR); Sang Sic Yoon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 116 days.

(21) Appl. No.: 18/448,475

(22) Filed: Aug. 11, 2023

(65) Prior Publication Data

US 2024/0061464 A1    Feb. 22, 2024

(30) Foreign Application Priority Data

Aug. 18, 2022  (KR) .................. 10-2022-0103293
Apr. 13, 2023  (KR) .................. 10-2023-0049058

(51) Int. Cl.
  *G06F 1/12*  (2006.01)
  *G06F 1/08*  (2006.01)

(52) U.S. Cl.
  CPC . *G06F 1/12* (2013.01); *G06F 1/08* (2013.01)

(58) Field of Classification Search
  CPC .................................. G06F 1/12; G06F 1/08
  See application file for complete search history.

(56) References Cited

U.S. PATENT DOCUMENTS

| | | | |
|---|---|---|---|
| 8,917,113 B1 * | 12/2014 | Song ................ | G01R 25/00 327/12 |
| 10,491,365 B1 * | 11/2019 | Lin ................ | H04L 43/028 |
| 11,004,499 B1 * | 5/2021 | Kim ................ | G11C 7/222 |
| 12,154,653 B2 * | 11/2024 | Jeong ................ | G11C 7/1093 |
| 2004/0100312 A1 * | 5/2004 | Cho ................ | H03L 7/0816 327/158 |
| 2012/0213020 A1 * | 8/2012 | Ware ................ | G06F 13/4086 365/191 |
| 2018/0033477 A1 * | 2/2018 | Gopalan ............ | G11C 29/022 |
| 2018/0218777 A1 * | 8/2018 | Koo ................ | G11C 5/04 |
| 2018/0241540 A1 * | 8/2018 | Shibasaki ............ | H03L 7/0807 |
| 2019/0007053 A1 * | 1/2019 | Hailu ................ | H03M 9/00 |
| 2019/0172512 A1 * | 6/2019 | Oh ................ | G11C 29/1201 |
| 2020/0021291 A1 * | 1/2020 | Jang ................ | G06F 1/12 |

(Continued)

FOREIGN PATENT DOCUMENTS

KR          101045070 B1     6/2011

*Primary Examiner* — Aurel Prifti
(74) *Attorney, Agent, or Firm* — WILLIAM PARK & ASSOCIATES LTD.

(57) ABSTRACT

A semiconductor device includes a command pulse generation circuit configured to generate a first command pulse in synchronization with a frequency division clock and to generate a second command pulse in synchronization with an inverted frequency division clock, based on a test write command. The semiconductor device also includes an alignment data generation circuit configured to align first internal data in an in-phase manner to generate first alignment data, based on the first command pulse, and to align second internal data in an out-of-phase manner to generate second alignment data, based on the second command pulse. The semiconductor device further includes a phase detection circuit configured to determine synchronization states of a clock and the frequency division clock, based on the first alignment data and the second alignment data.

21 Claims, 15 Drawing Sheets

(56) References Cited

U.S. PATENT DOCUMENTS

| | | | | |
|---|---|---|---|---|
| 2020/0143855 A1* | 5/2020 | Kim | ............... | G11C 7/1096 |
| 2020/0145015 A1* | 5/2020 | Im | ............... | H03L 7/18 |
| 2020/0319665 A1* | 10/2020 | Ito | ............... | G06F 1/10 |
| 2021/0271288 A1* | 9/2021 | Seo | ............... | H03K 5/135 |
| 2023/0223941 A1* | 7/2023 | Lee | ............... | G11C 11/4076 |
| 2025/0007525 A1* | 1/2025 | Zhu | ............... | H03L 7/16 |

* cited by examiner

FIG.4

| D_P | ALD1 | D_COM1 |
|---|---|---|
| 1100 | 1100 | H |
| | 0011 | L |

FIG.5

| D_P | ALD2 | D_COM2 |
|------|------|--------|
| 1100 | 0011 | H |
|      | 1100 | L |

FIG.6

| D_COM1 | D_COM2 | PHASE DECISION |
|---|---|---|
| L | L | FAIL |
| H | L | In-phase |
| L | H | Out-phase |
| H | H | FAIL |

FIG.12

| D_P | PSEL | ALD | PHASE DECISION |
|---|---|---|---|
| 1100 | H | 1100 | In-phase |
| | | 0011 | FAIL |
| | L | 0011 | Out-phase |
| | | 1100 | FAIL |

SEMICONDUCTOR DEVICES AND SEMICONDUCTOR SYSTEMS RELATED TO SYNCHRONIZATION BETWEEN CLOCKS

CROSS-REFERENCE TO RELATED APPLICATIONS

The present application claims priority under 35 U.S.C. 119(a) to Korean Patent Application No. 10-2022-0103293, filed on Aug. 18, 2022, and Korean Patent Application No. 10-2023-0049058, filed on Apr. 13, 2023, which are incorporated herein by references in their entireties.

BACKGROUND

1. Technical Field

Some embodiments of the present disclosure relate to semiconductor devices and semiconductor systems related to synchronization between clocks.

2. Related Art

A recent semiconductor system uses a data clock having a higher frequency than a clock frequency to input and output data for a high-speed operation. In general, a semiconductor system realizes the high-speed operation by inputting/outputting data by aligning data with a plurality of frequency division clocks generated by dividing the frequency of the data clock. When the data clock starts toggling, because the frequency divider that divides the frequency of the data clock is in a metastable state, synchronization between the frequency division clock and the clock may become imprecise.

SUMMARY

In accordance with an embodiment of present disclosure is a semiconductor device including a command pulse generation circuit configured to generate a first command pulse in synchronization with a frequency division clock and to generate a second command pulse in synchronization with an inverted frequency division clock, based on a test write command, an alignment data generation circuit configured to align first internal data in an in-phase manner to generate first alignment data, based on the first command pulse, and to align second internal data in an out-of-phase manner to generate second alignment data, based on the second command pulse, and a phase detection circuit configured to determine synchronization states of a clock and the frequency division clock, based on the first alignment data and the second alignment data.

In accordance with an embodiment of the present disclosure is a semiconductor device including a command pulse generation circuit configured to generate a first command pulse in synchronization with a frequency division clock, and to generate a second command pulse in synchronization with an inverted frequency division clock, based on a test write command, an alignment data generation circuit configured to align internal data in an in-phase manner to generate first alignment data, based on the first command pulse, and to align the internal data in an out-of-phase manner to generate second alignment data, based on the second command pulse, and a phase detection circuit configured to determine synchronization states of a clock and the frequency division clock, based on the first alignment data and the second alignment data.

In accordance with an embodiment of the present disclosure is a semiconductor device including a selection clock generation circuit configured to generate a selection clock from a frequency division clock, based on a phase selection signal, a command pulse generation circuit configured to generate a command pulse in synchronization with the selection clock, based on a test write command, an alignment data generation circuit configured to align internal data to generate alignment data, based on the command pulse, and a phase detection circuit configured to determine synchronization states of a clock and the frequency division clock, based on the phase selection signal and the alignment data.

In accordance with an embodiment of the present disclosure is a semiconductor system including a controller configured to apply a command, a clock, a data clock, first data, and second data, and a semiconductor device configured to sequentially generate a clock synchronization command and a test write command, based on the command for performing a test write operation, to divide a frequency of the data clock to generate a frequency division clock and an inverted frequency division clock, to align first internal data and second internal data generated by buffering the first data and the second data to generate first alignment data and second align data, based on a first command pulse and a second command pulse generated in synchronization with the frequency division clock and the inverted frequency division clock, and to determine synchronization states of the clock and the frequency division clock, based on the first alignment data and the second align data.

In accordance with an embodiment of the present disclosure is a semiconductor system including a controller configured to apply a command, a clock, a data clock, and data, and a semiconductor device configured to sequentially generate a clock synchronization command and a test write command, based on the command for performing a test write operation, to divide a frequency of the data clock to generate a frequency division clock and an inverted frequency division clock, to align internal data generated by buffering the data to generate first alignment data and second align data, based on a first command pulse and a second command pulse generated in synchronization with the frequency division clock and the inverted frequency division clock, and to determine synchronization states of the clock and the frequency division clock, based on the first alignment data and the second alignment data.

In accordance with an embodiment of the present disclosure is a semiconductor system including a controller configured to apply a command, a clock, a data clock, and data, and a semiconductor device configured to sequentially generate a clock synchronization command and a test write command, based on the command for performing a test write operation, to divide a frequency of the data clock to generate a frequency division clock, to output the frequency division clock or an inverted frequency division clock as a selection clock, based on a phase selection signal, to align internal data generated by buffering the data to generate alignment data, based on a command pulse generated in synchronization with the selection clock, and to determine synchronization states of the clock and the frequency division clock, based on the phase selection signal and the alignment data.

BRIEF DESCRIPTION OF THE DRAWINGS

FIGS. 4 to 6 are tables illustrating operations of the phase detection circuit shown in FIG. 3.

FIG. 12 is a table illustrating a test write operation of the semiconductor device shown in FIG. 10.

DETAILED DESCRIPTION

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period in which the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

The term "logic bit set" may mean a combination of logic levels of bits included in a signal. When the logic level of each of the bits included in the signal is changed, the logic bit set of the signal may be set differently. For example, when the signal includes 2 bits, when the logic level of each of the 2 bits included in the signal is "logic low level, logic low level", the logic bit set of the signal may be set as the first logic bit set, and when the logic level of each of the two bits included in the signal is "a logic low level and a logic high level", the logic bit set of the signal may be set as the second logic bit set.

Various embodiments of the present disclosure will be described hereinafter in more detail with reference to the accompanying drawings. However, the embodiments described herein are for illustrative purposes only and are not intended to limit the scope of the present disclosure.

Figure 1:
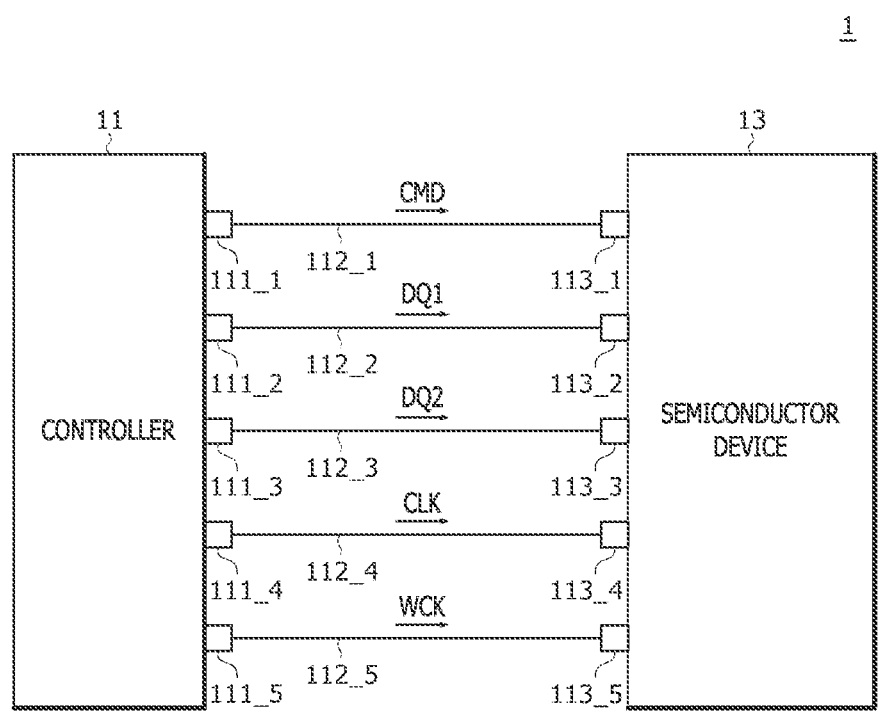
FIG. 1 is a block diagram illustrating a configuration of a semiconductor system according to an embodiment of the present disclosure.

FIG. 1 is a block diagram illustrating a configuration of a semiconductor system 1 according to an embodiment of the present disclosure. As shown in FIG. 1, the semiconductor system 1 may include a controller 11 and a semiconductor device 13.

The controller 11 may include a first control pin 111_1, a second control pin 111_2, a third control pin 111_3, a fourth control pin 111_4, and a fifth control pin 111_5. The semiconductor device 13 may include a first device pin 113_1, a second device pin 113_2, a third device pin 113_3, a fourth device pin 113_4, and a fifth device pin 113_5. The controller 11 may transmit a command CMD to the semiconductor device 13 through a first transmission line 112_1 connected between the first control pin 111_1 and the first device pin 113_1. The command CMD may include a plurality of bits, and logic bit sets of the plurality of bits included in the command CMD may be set differently for internal operations of the semiconductor device 13, including a write operation and a read operation. The first control pin 111_1, the first device pin 113_1, and the first transmission line 112_1 are indicated as one, but may be provided for each of the plurality of bits included in the command CMD. The controller 11 may apply first data DQ1 to the semiconductor device 13 through a second transmission line 112_2 connected between the second control pin 111_2 and the second device pin 113_2. The first data DQ1 may be set to be the same as a data pattern (D_P in FIG. 3). The controller 11 may apply second data DQ2 to the semiconductor device 13 through a third transmission line 112_3 connected between the third control pin 111_3 and the third device pin 113_3. The second data DQ2 may be set to be the same as the data pattern. The controller 11 may apply a clock CLK to the semiconductor device 13 through a fourth transmission line 112_4 connected between the fourth control pin 111_4 and the fourth device pin 113_4. The clock CLK may be a system clock to control the internal operations of the semiconductor device 13. The controller 11 may apply a data clock WCK to the semiconductor device 13 through a fifth transmission line 112_5 connected between the fifth control pin 111_5 and the fifth device pin 113_5. The data clock WCK may be used in the data input and output operations of the semiconductor device 13. According to an embodiment, the cycle of the data clock WCK may be set to be ½N times the cycle of the clock CLK. Here, 'N' may be set to a natural number.

The semiconductor device 13 may receive the command CMD, the first data DQ1, the second data DQ2, the clock CLK, and the data clock WCK to perform a test write operation for determining whether the clock CLK and a frequency division clock DWCK are synchronized. When the test write operation is performed based on the command CMD, the semiconductor device 13 may align the first data DQ1 in an in-phase manner to generate first alignment data (ALD1 in FIG. 2), and align the second data DQ2 in an out-of-phase manner to generate second alignment data (ALD2 in FIG. 2). The semiconductor device 13 may compare the first alignment data (ALD1 in FIG. 2) and the second alignment data (ALD2 in FIG. 2) with the data pattern (D_P in FIG. 3) to determine the clock CLK and the frequency division clock DWCK are synchronized.

The semiconductor system 1 may generate the first alignment data ALD1 from the first data DQ1 and generate the second alignment data ALD2 from the second data DQ2 through the test write operation, thereby determining whether the clock CLK and the frequency division clock DWCK are synchronized.

Figure 2:
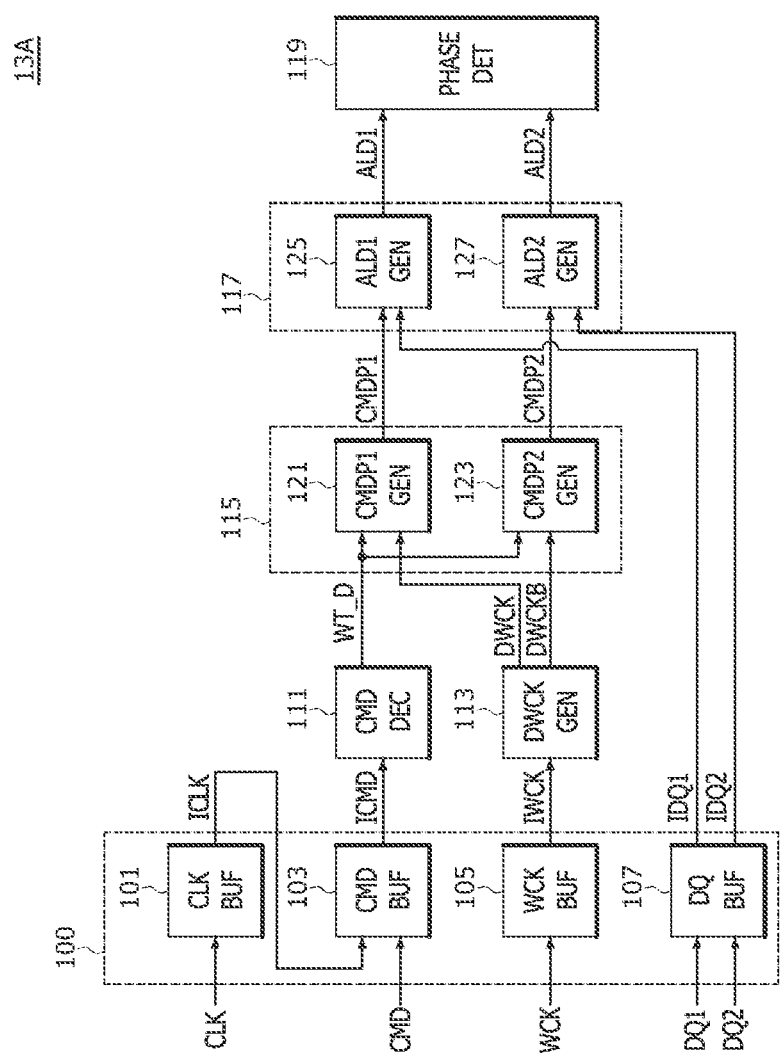
FIG. 2 is a block diagram illustrating a configuration, according to an embodiment, of a semiconductor device included in the semiconductor system shown in FIG. 1.

FIG. 2 is a block diagram illustrating a configuration of a semiconductor device 13A, according to an embodiment, of the semiconductor device 13 included in the semiconductor system 1 shown in FIG. 1. As shown in FIG. 2, the semiconductor device 13A may include a buffer circuit 100, a command decoder (CMD DEC) 111, a frequency division clock generation circuit (DWCK GEN) 113, a command pulse generation circuit 115, an alignment data generation circuit 117, and a phase detection circuit (PHASE DET) 119.

The buffer circuit 100 may include a clock buffer (CLK BUF) 101, a command buffer (CMD BUF) 103, a data clock buffer (WCK BUF) 105, and a data buffer (DQ BUF) 107. The clock buffer 101 may buffer the clock CLK received from the controller 11 to generate an internal clock ICLK. The command buffer 103 may receive the command CMD from the controller 11, and receive the internal clock ICLK from the clock buffer 101. The command buffer 103 may buffer the command CMD in synchronization with the internal clock ICLK to generate an internal command ICMD. The data clock buffer 105 may buffer the data clock WCK received from the controller 11 to generate an internal data clock IWCK. The data buffer 107 may buffer the first data DQ1 and the second data DQ2 received from the controller 11 to generate first internal data IDQ1 and second internal data IDQ2.

The command decoder 111 may receive the internal command ICMD from the command buffer 103. The command decoder 111 may decode the internal command ICMD to generate a test write command WT_D. The command decoder 111 may generate the test write command WT_D to perform the test write operation for determining whether the clock CLK and the frequency division clock DWCK are synchronized.

The frequency division clock generation circuit 113 may receive the internal data clock IWCK from the data clock buffer 105. The frequency division clock generation circuit 113 may divide the frequency of the internal data clock IWCK to generate a frequency division clock DWCK and an inverted frequency division clock DWCKB. The inverted frequency division clock DWCKB may be set to be out-of-phase with the frequency division clock DWCK, that is, to have a phase difference of 180° from the frequency division clock DWCK. The cycle of each of the frequency division clock DWCK and the inverted frequency division clock DWCKB may be set to be 2M times the cycle of the internal data clock IWCK. Here, 'M' may be set to a natural number.

The command pulse generation circuit 115 may receive the test write command WT_D from the command decoder 111, and receive the frequency division clock DWCK and the inverted frequency division clock DWCK from the frequency division clock generation circuit 113. The command pulse generation circuit 115 may generate a first command pulse CMDP1 and a second command pulse CMDP2, based on the frequency division clock DWCK and the inverted frequency division clock DWCKB. The command pulse generation circuit 115 may include a first command pulse generation circuit (CMDP1 GEN) 121 and a second command pulse generation circuit (CMDP2 GEN) 123.

The first command pulse generation circuit 121 may generate the first command pulse CMDP1, based on the test write command WT_D and the frequency division clock DWCK. The first command pulse generation circuit 121 may generate the first command pulse CMDP1 in synchronization with the frequency division clock DWCK when the test write command WT_D is generated for the test write operation. In an embodiment, the first command pulse generation circuit 121 may generate the first command pulse CMDP1 in synchronization with a rising edge of the frequency division clock DWCK, which is generated after the test write command WT_D has generated and a preset pulse generation period has elapsed. The pulse generation period may be set in various ways according to different embodiments, and the first command pulse CMDP1 may be generated in synchronization with a falling edge of the frequency division clock DWCK.

The second command pulse generation circuit 123 may generate the second command pulse CMDP2, based on the test write command WT_D and the inverted frequency division clock DWCKB. The second command pulse generation circuit 123 may generate the second command pulse CMDP2 in synchronization with the inverted frequency division clock DWCKB when the test write command WT_D is generated for the test write operation. For example, the second command pulse generation circuit 123 may generate the second command pulse CMDP2 in synchronization with a rising edge of the inverted frequency division clock DWCKB, which is generated after the test write command WT_D has generated and the pulse generation period has elapsed. According to an embodiment, the second command pulse CMDP2 may be generated in synchronization with a falling edge of the inverted frequency division clock DWCKB.

The alignment data generation circuit 117 may receive the first internal data IDQ1 and the second internal data IDQ2 from the data buffer 107, and receive the first command pulse CMDP1 and the second command pulse CMDP2 from the command pulse generation circuit 115. The alignment data generation circuit 117 may align the first internal data IDQ1 and the second internal data IDQ2 to generate the first alignment data ALD1 and the second alignment data ALD2, based on the first command pulse CMDP1 and the second command pulse CMDP2. The alignment data generation circuit 117 may include a first alignment data generation circuit (ALD1 GEN) 125 and a second alignment data generation circuit (ALD2 GEN) 127.

The first alignment data generation circuit 125 may align the first internal data IDQ1 to generate the first alignment data ALD1, based on the first command pulse CMDP1. The first alignment data generation circuit 125 may align the first internal data IDQ1 in an in-phase manner to generate the first alignment data ALD1 when the first command pulse CMDP1 is generated in synchronization with the frequency division clock DWCK. For example, when the first internal data IDQ1 having a data pattern (D_P of FIG. 3) set to have a logic bit set '1100' is received, the first alignment data generation circuit 125 may align the first internal data IDQ1 in an in-phase manner to generate the first alignment data ALD1. When the clock CLK and the frequency division clock DWCK are synchronized in an in-phase manner, the first alignment data ALD1 may be set to be in-phase with the first internal data IDQ1, that is, may be set to be in-phase with the data pattern (D_P in FIG. 3) set to have the 4-bit logic bit set '1100'.

The second alignment data generation circuit 127 may align the second internal data IDQ2 to generate the second alignment data ALD2, based on the second command pulse CMDP2. The second alignment data generation circuit 127 may align the second internal data IDQ2 in an out-of-phase manner to generate the second alignment data ALD2 when the second command pulse CMDP2 is generated in synchronization with the inverted frequency division clock DWCKB. For example, when the second internal data IDQ2 having a data pattern (D_P of FIG. 3) set to have a 4-bit logic bit set '1100' is received, the second alignment data generation circuit 127 may align the second internal data IDQ2 in an out-of-phase manner to generate the second alignment data ALD2. When the clock CLK and the frequency division clock DWCK are synchronized in an out-of-phase manner, the second alignment data ALD2 may be set to be out-of-phase with the second internal data IDQ2, that is, may be set to be out-of-phase with the data pattern (D_P in FIG. 3) set to have the 4-bit logic bit set '0011'.

The phase detection circuit 119 may receive the first alignment data ALD1 and the second alignment data ALD2 from the alignment data generation circuit 117. The phase detection circuit 119 may determine the synchronization states of the clock CLK and the frequency division clock DWCK, based on the first alignment data ALD1 and the second alignment data ALD2. As an example, the phase detection circuit 119 may determine that the clock CLK and the frequency division clock DWCK are synchronized in an in-phase manner when the first alignment data ALD1 is set to be in-phase with the data pattern (D_P in FIG. 3) and the second alignment data ALD2 is not set to be out-of-phase with the data pattern (D_P in FIG. 3). As another example, the phase detection circuit 119 may determine that the clock CLK and the frequency division clock DWCK are synchronized in an out-of-phase manner when the first alignment data ALD1 is not set to be in-phase with the data pattern (D_P in FIG. 3) and the second alignment data ALD2 is set to be out-of-phase with the data pattern (D_P in FIG. 3). As a further example, the phase detection circuit 119 may determine that the clock CLK and the frequency division clock DWCK fail in synchronization when the first alignment data ALD1 is not set to be in-phase with the data pattern (D_P in FIG. 3) and the second alignment data ALD2 is not set to be out-of-phase with the data pattern (D_P in FIG. 3). As a further example, the phase detection circuit 119 may determine that the clock CLK and the frequency division clock DWCK fail in synchronization when the first alignment data ALD1 is set to be in-phase with the data pattern (D_P in FIG. 3) and the second alignment data ALD2 is set to be out-of-phase with the data pattern (D_P in FIG. 3). This is because the clock CLK and the frequency division clock DWCK cannot be simultaneously synchronized in an in-phase and out-of-phase manner.

Figure 3:
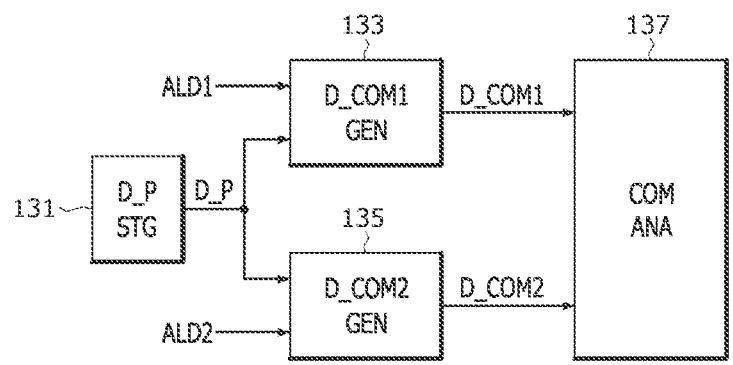
FIG. 3 is a block diagram illustrating a configuration, according to an embodiment, of a phase detection circuit included in the semiconductor device shown in FIG. 2.

FIG. 3 is a block diagram illustrating a configuration of a phase detection circuit 119A, according to an embodiment, of the phase detection circuit 119 shown in FIG. 2. As shown in FIG. 3, the phase detection circuit 119A may include a data pattern storage circuit (D_P STG) 131, a first comparison signal generation circuit (D_COM1 GEN) 133, a second comparison signal generation circuit (D_COM2 GEN) 135, and a comparison signal analysis circuit (COM ANA) 137.

The data pattern storage circuit 131 may receive and store the data pattern D_P, based on a data pattern write operation. The data pattern write operation may be implemented as a mode register write operation performed under the control of the controller 11. The data pattern storage circuit 131 may receive and store the data pattern D_P applied from the controller 11 when the data pattern write operation is performed. The data pattern write operation may proceed prior to the test write operation.

The first comparison signal generation circuit 133 may receive the data pattern D_P from the data pattern storage circuit 131. The first comparison signal generation circuit 133 may compare the first alignment data ALD1 and the data pattern D_P to generate a first comparison signal D_COM1. The first comparison signal generation circuit 133 may generate the first comparison signal D_COM1 set to have a first logic level when the first alignment data ALD1 is set to be in-phase with the data pattern D_P. The first comparison signal generation circuit 133 may generate the first comparison signal D_COM1 set to have a second logic level when the first alignment data ALD1 is not set to be in-phase with the data pattern D_P. In the present embodiment, the first logic level may be set to a logic "high" level, and the second logic level may be set to a logic "low" level, but is not limited thereto.

The second comparison signal generation circuit 135 may receive the data pattern D_P from the data pattern storage circuit 131. The second comparison signal generation circuit 135 may compare the second alignment data ALD2 and the data pattern D_P to generate a second comparison signal D_COM2. The second comparison signal generation circuit 135 may generate the second comparison signal D_COM2 set to have a first logic level when the second alignment data ALD2 is set to be out-of-phase with the data pattern D_P. The second comparison signal generation circuit 135 may generate the second comparison signal D_COM2 set to have a second logic level when the second alignment data ALD2 is not set to be out-of-phase with the data pattern D_P.

The comparison signal analysis circuit 137 may receive the first comparison signal D_COM1 from the first comparison signal generation circuit 133, and receive the second comparison signal D_COM2 from the second comparison signal generation circuit 135. The comparison signal analysis circuit 137 may determine the synchronization states of the clock CLK and the frequency division clock DWCK, based on the first comparison signal D_COM1 and the second comparison signal D_COM2. As an example, when the first alignment data ALD1 is set to be in-phase with the data pattern D_P and the second alignment data ALD2 is not set to be out-of-phase with the data pattern D_P, the comparison signal analysis circuit 137 may receive the first comparison signal D_COM1 set to have a first logic level and the second comparison signal D_COM2 set to have a second logic level to determine that the clock CLK and the frequency division clock DWCK are synchronized in an in-phase manner. As another example, when the first alignment data ALD1 is not set to be in-phase with the data pattern D_P and the second alignment data ALD2 is set to be out-of-phase with the data pattern D_P, the comparison signal analysis circuit 137 may receive the first comparison signal D_COM1 set to have a second logic level and the second comparison signal D_COM2 set to have a first logic level to determine that the clock CLK and the frequency division clock DWCK are synchronized in an out-of-phase manner. As a further example, when the first alignment data ALD1 is not set to be in-phase with the data pattern D_P and the second alignment data ALD2 is not set to be out-of-phase with the data pattern D_P, the comparison signal analysis circuit 137 may receive the first comparison signal D_COM1 and the second comparison signal D_COM2 both set to have a second logic level to determine that the clock CLK and the frequency division clock DWCK fail in synchronization. As a further example, when the first alignment data ALD1 is set to be in-phase with the data pattern D_P and the second alignment data ALD2 is set to be out-of-phase with the data pattern D_P, the comparison signal analysis circuit 137 may receive the first comparison signal D_COM1 and the second comparison signal D_COM2 both set to have a first logic level to determine that the clock CLK and the frequency division clock DWCK fail in synchronization.

Figure 4:
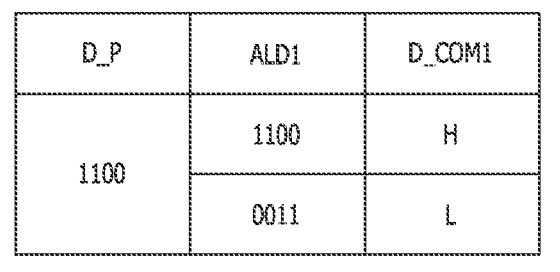
Figure 5:
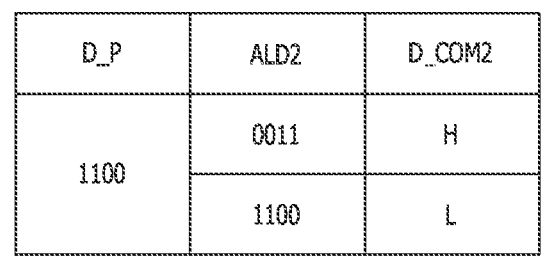

FIGS. 4 to 6 are tables illustrating an operation of the phase detection circuit 119A shown in FIG. 3.

Referring to FIGS. 3 and 4, the first comparison signal generation circuit 133 may receive the data pattern D_P set to have 4-bit logic bit set '1100' from the data pattern storage circuit 131, and compare the first alignment data ALD1 and the data pattern D_P to generate the first comparison signal D_COM1. As an example, the first comparison signal generation circuit 133 may generate the first comparison signal D_COM1 set to have a logic "high" level 'H' when the first alignment data ALD1 has the 4-bit logic bit set '1100'. As another example, the first comparison signal generation circuit 133 may generate the first comparison signal D_COM1 set to have a logic "low" level 'L' when the first alignment data ALD1 is set to have the 4-bit logic bit set '0011'.

Referring to FIGS. 3 and 5, the second comparison signal generation circuit 135 may receive the data pattern D_P set to have the 4-bit logic bit set '1100' from the data pattern storage circuit 131, and compare the second alignment data ALD2 and the data pattern D_P to generate the second comparison signal D_COM2. As an example, the second comparison signal generation circuit 135 may generate the second comparison signal D_COM2 set to have a logic "high" level 'H' when the second alignment data ALD2 is set to have the 4-bit logic bit set '0011'. As another example, the second comparison signal generation circuit 135 may generate the second comparison signal D_COM5 set to have a logic "low" level 'L' when the second alignment data ALD5 is set to have the 4-bit logic bit set '1100'.

Referring to FIGS. 3 and 6, the comparison signal analysis circuit 137 may determine the synchronization states of the clock CLK and the frequency division clock DWCK, based on the first comparison signal D_COM1 and the second comparison signal D_COM2. As an example, when the first alignment data ALD1 is not set to be in-phase with the data pattern (D_P in FIG. 3), and the second alignment data ALD2 is not set to be out-of-phase with the data pattern (D_P in FIG. 3), the comparison signal analysis circuit 137 may receive the first comparison signal D_COM1 and the second comparison signal D_COM2 both set to have a logic "low" level 'L' to determine that the clock CLK and the frequency division clock DWCK fail in synchronization. As another example, when the first alignment data ALD1 is set to be in-phase with the data pattern D_P and the second alignment data ALD2 is not set to be out-of-phase with the data pattern (D_P in FIG. 3), the comparison signal analysis circuit 137 may receive the first comparison signal D_COM1 set to have a logic "high" level 'H' and the second comparison signal D_COM2 set to have a logic "low" level 'L' to determine that the clock CLK and the frequency division clock DWCK are synchronized in an in-phase manner. As a further example, when the first alignment data ALD1 is not set to be in-phase with the data pattern D_P and the second alignment data ALD2 is set to be out-of-phase with the data pattern (D_P in FIG. 3), the comparison signal analysis circuit 137 may receive the first comparison signal D_COM1 set to have a logic "low" level 'L' and the second comparison signal D_COM2 set to have a logic "high" level 'H' to determine that the clock CLK and the frequency division clock DWCK are synchronized in an out-of-phase manner. As a further example, when the first alignment data ALD1 is set to be in-phase with the data pattern (D_P in FIG. 3) and the second alignment data ALD2 is set to be out-of-phase with the data pattern (D_P in FIG. 3), the comparison signal analysis circuit 137 may receive the first comparison signal D_COM1 and the second comparison signal D_COM2 both set to have a logic "high" level 'H' to determine that the clock CLK and the frequency division clock DWCK fail in synchronization.

Figure 7:
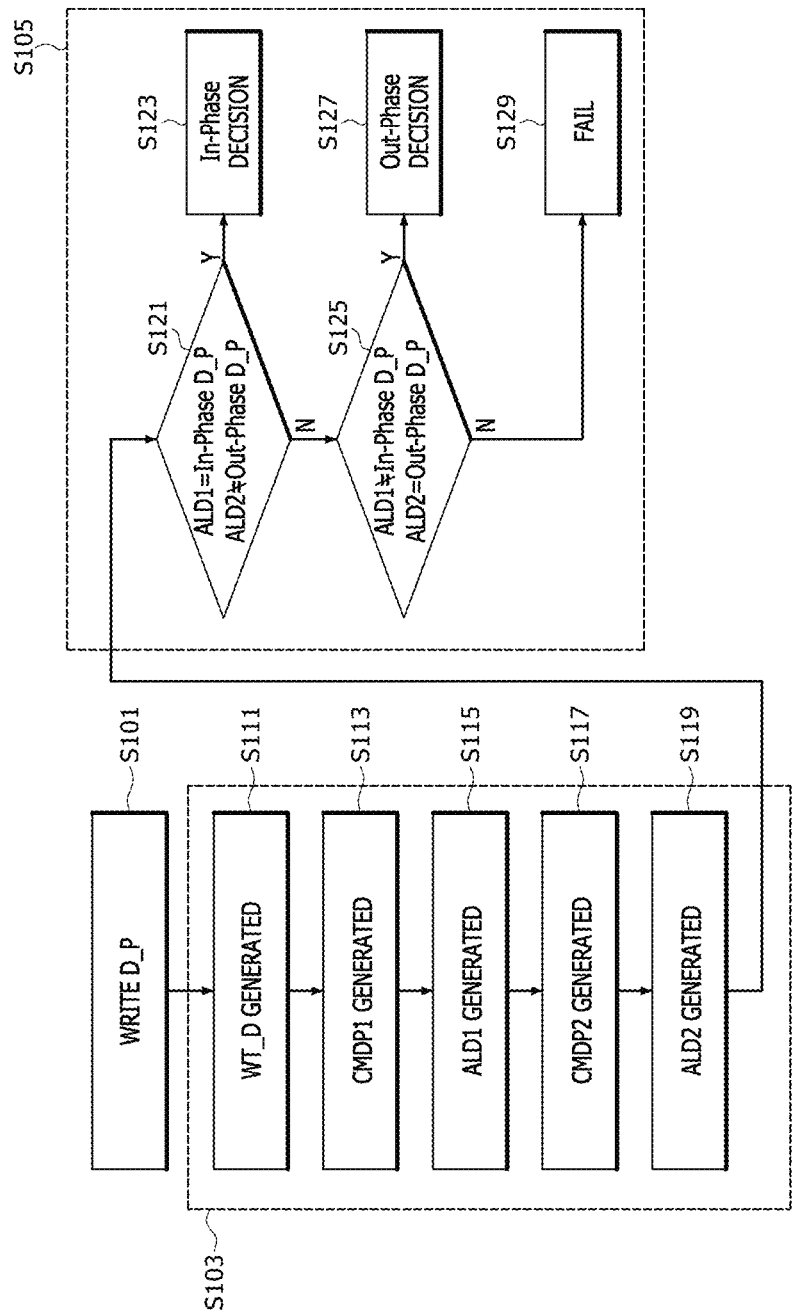
FIG. 7 is a timing diagram illustrating an operation of a semiconductor system according to an embodiment of the present disclosure.

FIG. 7 is a timing diagram illustrating an operation of a semiconductor system 1 according to an embodiment of the present disclosure. The operation of the semiconductor system 1 will be described with reference to FIG. 7, but will be divided into a data pattern write operation S101, a test write operation S103, and a phase detection operation S105 and described as follows.

First, under the control of the controller 11, the data pattern write operation S101 in which the data pattern storage circuit 131 receives and stores the data pattern D_P may be performed.

Next, the test write operation S103 may be performed. The test write operation S103 may proceed in the order of generating the test write command WT_D by the command decoder 111 (S111), generating the first command pulse CMDP1 in synchronization with the frequency division clock DWCK (S113), and generating the first alignment data ALD1 by aligning the first internal data IDQ1 in an in-phase manner, based on the first command pulse CMDP1 (S115). In addition, the test write operation S103 may be additionally performed in the order of generating the second command pulse CMDP2 in synchronization with the inverted frequency division clock DWCKB (S117), and generating the second alignment data ALD2 by aligning the second internal data IDQ2, based on the second command pulse CMDP2 (S119).

Finally, the phase detection operation (S105) may be performed. The phase detection operation (S105) may be performed in a manner in which synchronization states of the clock CLK and the frequency division clock DWCK are determined based on the first alignment data ALD1 and the second alignment data ALD2. In the phase detection operation (S105), when the first alignment data ALD1 is set to be in-phase with the data pattern D_P and the second alignment data ALD2 is not set to be out-of-phase with the data pattern D_P (S121), it may be determined that the clock CLK and the frequency division clock DWCK are synchronized in an in-phase manner (S123). In the phase detection operation (S105), when the first alignment data ALD1 is not set to be in-phase with the data pattern D_P and the second alignment data ALD2 is set to be out-of-phase with the data pattern D_P (S125), it may be determined that the clock CLK and the frequency division clock DWCK are synchronized in an out-of-phase manner (S127). Meanwhile, when the first alignment data ALD1 is set to be in-phase with the data pattern D_P and the second alignment data ALD2 is set to be out-of-phase with the data pattern D_P (S125), or when the first alignment data ALD1 is not set to be in-phase with the data pattern D_P and the second alignment data ALD2 is not set to be out-of-phase with the data pattern D_P, it may be determined that the clock CLK and the frequency division clock DWCK fail in synchronization (S129).

Figure 8:
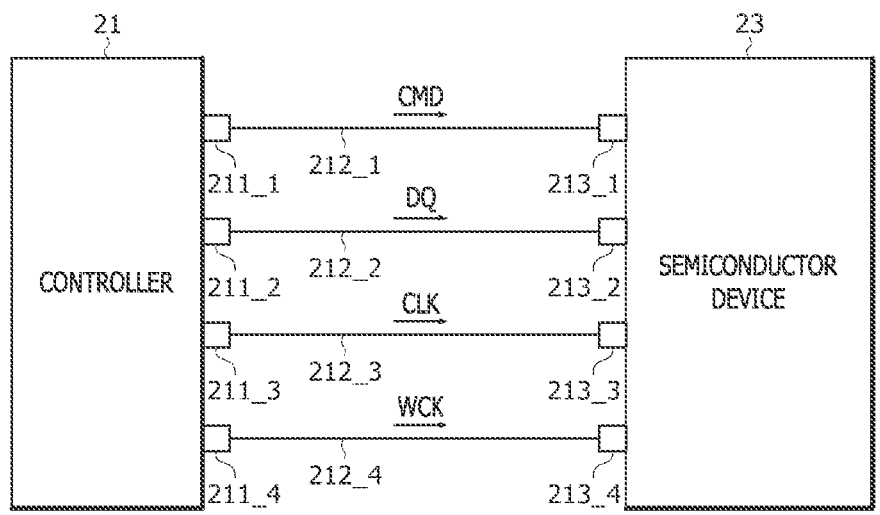
FIG. 8 is a block diagram illustrating a configuration of a semiconductor system according to another embodiment of the present disclosure.

FIG. 8 is a block diagram illustrating a configuration of a semiconductor system 2 according to another embodiment of the present disclosure. As shown in FIG. 8, the semiconductor system 2 may include a controller 21 and a semiconductor device 23.

The controller 21 may include a first control pin 211_1, a second control pin 211_2, a third control pin 211_3, and a fourth control pin 211_4. The semiconductor device 23 may include a first device pine 213_1, a second device pin 213_2, a third device pin 213_3, and a fourth device pin 213_4. The controller 21 may transmit a command CMD to the semiconductor device 23 through a first transmission line 212_1 connected between the first control pin 211_1 and the first device pine 213_1. The command CMD may include a plurality of bits, and logic bit sets of the plurality of bits included in the command CMD may be set differently for each internal operation of the semiconductor device 23, including a write operation and a read operation. The first control pin 211_1, the first device pin 213_1, and the first transmission line 212_1 are indicated as one, but may be provided for each of the plurality of bits included in the command CMD. The controller 21 may apply data DQ to the semiconductor device 23 through a second transmission line 212_2 connected between the second control pin 211_2 and the second device pin 213_2. The data DQ may be set to be the same as a data pattern D_P. The controller 21 may apply a clock CLK to the semiconductor device 23 through a third transmission line 212_3 connected between the third control pin 211_3 and the third device pin 213_3. The controller 21 may apply a data clock WCK to the semiconductor device 23 through a fourth transmission pin 212_4 connected between the fourth control pin 211_4 and the fourth device pin 213_4.

The semiconductor device 23 may receive the command CMD, the data DQ, the system clock CLK, and the data clock WCK from the controller 21 to perform a test write operation for determining whether the clock CLK and a frequency division clock DWCK are synchronized. When the test write operation is performed based on the command CMD, the semiconductor device 23 may align the data DQ in an in-phase manner to generate first alignment data ALD1, and align the data DQ in an out-of-phase manner to generate second alignment data ALD2. The semiconductor device 23 may compare the first alignment data ALD1 and the second alignment data ALD2 with the data pattern D_P to determine whether the clock CLK and the frequency division clock DWCK are synchronized.

The semiconductor system 2 may be distinguished from the semiconductor system 1 shown in FIG. 1, which uses the first data DQ1 and the second data DQ2 to generate the first alignment data ALD1 and the second alignment data ALD2, in that the semiconductor system 2 aligns one piece of data DQ in an in-phase and out-of-phase manner to generate the first alignment data ALD1 and the second alignment data ALD2. The semiconductor system 2 may generate the first alignment data ALD1 and the second alignment data ALD2 from the one piece of data DQ through the test write operation, thereby effectively determining whether the clock CLK and the frequency division clock DWCK are synchronized.

Figure 9:
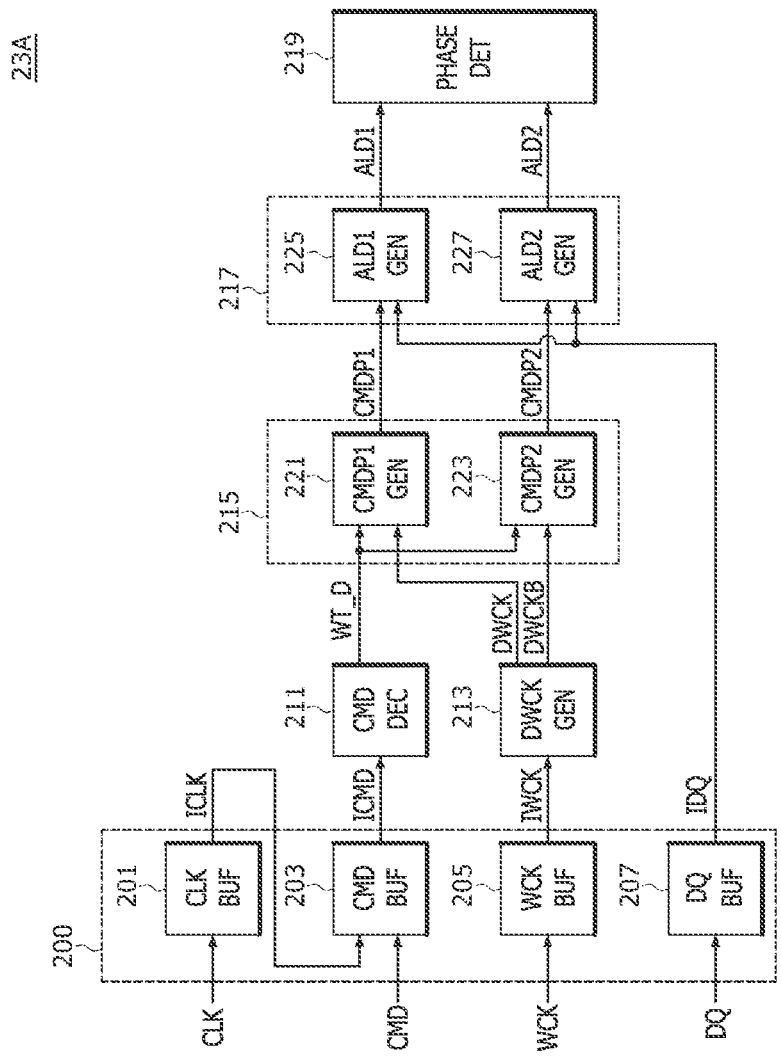
FIG. 9 is a block diagram illustrating a configuration, according to an embodiment, of a semiconductor device included in the semiconductor system shown in FIG. 8.

FIG. 9 is a block diagram illustrating a configuration of a semiconductor device 23A, according to an embodiment, of the semiconductor device 23 shown in FIG. 8. As shown in FIG. 9, the semiconductor device 23A may include a buffer circuit 200, a command decoder (CMD DEC) 211, a frequency division clock generation circuit (DWCK GEN) 213, a command pulse generation circuit 215, an alignment data generation circuit 217, and a phase detection circuit (PHASE DET) 219.

The buffer circuit 200 may include a clock buffer (CLK BUF) 201, a command buffer (CMD BUF) 203, a data clock buffer (WCK BUF) 205, and a data buffer (DQ BUF) 207. The clock buffer 201 may buffer the clock CLK received from the controller (21 of FIG. 8) to generate an internal clock ICLK. The command buffer 203 may receive the command CMD from the controller 21 and receive the internal clock ICLK from the clock buffer 201. The command buffer 203 may buffer the command CMD in synchronization with the internal clock ICLK to generate an internal command ICMD. The data clock buffer 205 may buffer the data clock WCK received from the controller 21 to generate an internal data clock IWCK. The data buffer 207 may buffer the data DQ received from the controller 21 to generate internal data IDQ.

The command decoder 211 may receive the internal command ICMD from the command buffer 203. The command decoder 211 may decode the internal command ICMD to generate a test write command WT_D. The command decoder 211 may generate the test write command WT_D to perform the test write operation for determining whether the clock CLK and the frequency division clock DWCK are synchronized.

The frequency division clock generation circuit 213 may receive the internal data clock IWCK from the data clock buffer 205. The frequency division clock generation circuit 213 may divide the frequency of the internal data clock IWCK to generate the frequency division clock DWCK and an inverted frequency division clock DWCKB.

The command pulse generation circuit 215 may receive the test write command WT_D from the command decoder 211, and receive the frequency division clock DWCK and the inverted frequency division clock DWCKB from the frequency division clock generation circuit 213. The command pulse generation circuit 215 may generate a first command pulse CMDP1 and a second command pulse CMDP2, based on the test write command WT_D, the frequency division clock DWCK, and the inverted frequency division clock DWCKB. The command pulse generation circuit 215 may include a first command pulse generation circuit (CMDP1 GEN) 221 and a second command pulse generation circuit (CMDP2 GEN) 223. The first command pulse generation circuit 221 may generate the first command pulse CMDP1, based on the test write command WT_D and the frequency division clock DWCK. The first command pulse generation circuit 221 may generate the first command pulse CMDP1 in synchronization with the frequency division clock DWCK when the test write command WT_D is generated for the test write operation. The second command pulse generation circuit 223 may generate the second command pulse CMDP2, based on the test write command WT_D and the inverted frequency division clock DWCKB. The second command pulse generation circuit 223 may generate the second command pulse CMDP2 in synchronization with the inverted frequency division clock DWCKB when the test write command WT_D is generated for the test write operation.

The alignment data generation circuit 217 may receive the internal data IDQ from the data buffer 207, and receive the first command pulse CMDP1 and the second command pulse CMDP2 from the command pulse generation circuit 215. The alignment data generation circuit 217 may align the internal data IDQ, based on the first command pulse CMDP1 and the second command pulse CMDP2 to generate the first alignment data ALD1 and the second alignment data ALD2. The alignment data generation circuit 217 may include a first alignment data generation circuit (ALD1 GEN) 225 and a second alignment data generation circuit (ALD2 GEN) 227. The first alignment data generation circuit 225 may align the internal data IDQ, based on the first command pulse CMDP1 to generate the first alignment data ALD1. The first alignment data generation circuit 225 may align the internal data IDQ in an in-phase manner to generate the first alignment data ALD1 when the first command pulse CMDP1 is generated in synchronization with the frequency division clock DWCK.

The second alignment data generation circuit 227 may align the internal data IDQ, based on the second command pulse CMDP2 to generate the second alignment data ALD2. The second alignment data generation circuit 227 may align the internal data IDQ in an out-of-phase manner to generate the second alignment data ALD2 when the second command pulse CMDP2 is generated in synchronization with the inverted frequency division clock DWCKB.

The phase detection circuit 219 may receive the first alignment data ALD1 and the second alignment data ALD2 from the alignment data generation circuit 217. The phase detection circuit 219 may determine the synchronization states of the clock CLK and the frequency division clock DWCK, based on the first alignment data ALD1 and the second alignment data ALD2.

The semiconductor device 23A may be different from the semiconductor device 13 shown in FIG. 2, which performs the test write operation using the first data DQ1 and the second data DQ2, in that the semiconductor device 23A not only buffers one piece of data DQ to generate the internal data IDQ, but also aligns the one piece of data DQ in an in-phase and out-of-phase manner to generate the first alignment data ALD1 and the second alignment data ALD2.

Figure 10:
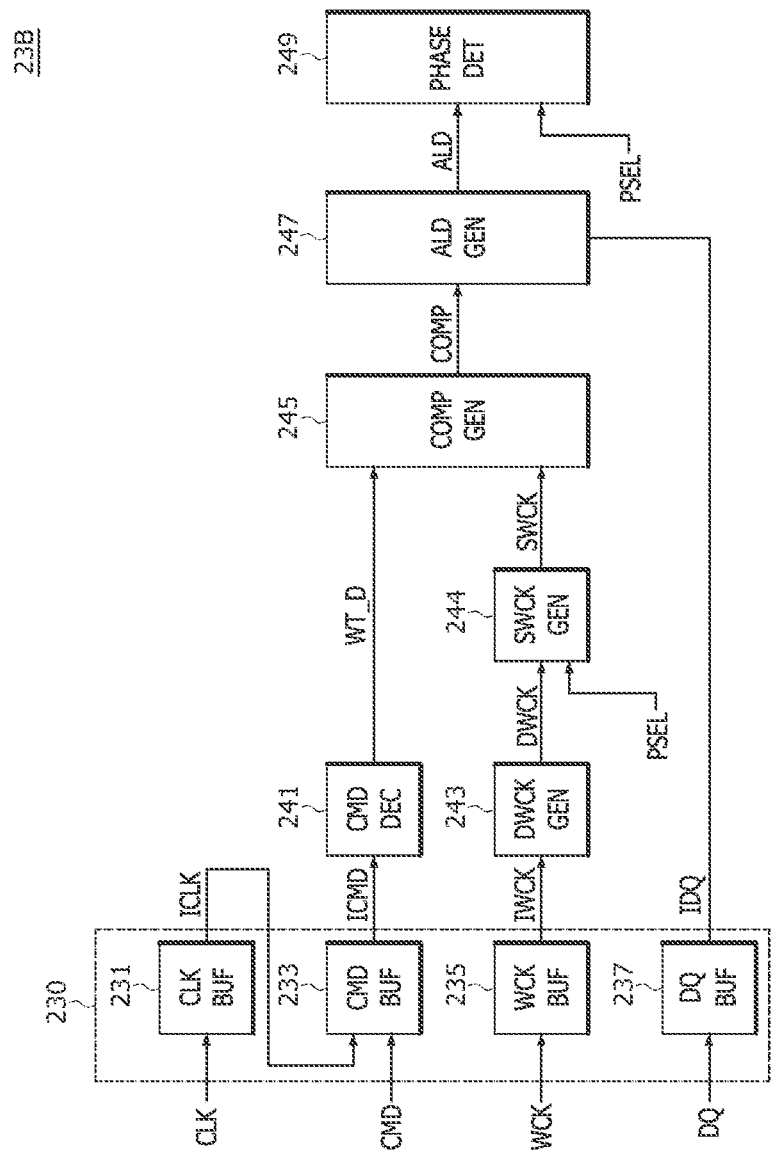
FIG. 10 is a block diagram illustrating a configuration, according to another embodiment, of the semiconductor device included in the semiconductor system shown in FIG. 8.

FIG. 10 is a block diagram illustrating a configuration of a semiconductor device 23B, according to an embodiment, of the semiconductor device 23 shown in FIG. 8. As shown in FIG. 10, the semiconductor device 23B may include a buffer circuit 230, a command decoder (CMD DEC) 241, a frequency division clock generation circuit (DWCK GEN) 243, a selection clock generation circuit (SWCK GEN) 244, a command pulse generation circuit (COMP GEN) 245, an alignment data generation circuit (ALD GEN) 247, and a phase detection circuit (PHASE DET) 249.

The buffer circuit 230 may include a clock buffer (CLK BUF) 231, a command buffer (CMD BUF) 233, a data clock buffer (WCK BUF) 235, and a data buffer (DQ BUF) 237. The clock buffer 231 may buffer the clock CLK received from the controller (21 of FIG. 8) to generate the internal clock ICLK. The command buffer 233 may receive the command CMD from the controller 21, and receive the internal clock ICLK from the clock buffer 231. The command buffer 233 may buffer the command CMD in synchronization with the internal clock ICLK to generate the internal command ICMD. The data clock buffer 235 may buffer the data clock WCK received from the controller 21 to generate the internal data clock IWCK. The data buffer 237 may buffer the data DQ received from the controller 21 to generate the internal data IDQ.

The command decoder 241 may receive the internal command ICMD from the command buffer 233. The command decoder 241 may decode the internal command ICMD to generate the test write command WT_D. The command decoder 241 may generate the test write command WT_D to perform the test write operation for determining whether the clock CLK and the frequency division clock DWCK are synchronized.

The frequency division clock generation circuit 243 may receive the internal clock IWCK from the data clock buffer 235. The frequency division clock generation circuit 243 may divide the frequency of the internal data clock IWCK to generate the frequency division clock DWCK.

The selection clock generation circuit 244 may generate the selection clock SWCK from the frequency division clock DWCK, based on a phase selection signal PSEL. The phase selection signal PSEL may be set to have a first logic level to generate the alignment data ALD aligned in an in-phase manner in the test write operation, and be set to have a second logic level to generate the alignment data ALD aligned in an out-of-phase manner in the test write operation. The selection clock generation circuit 244 may output the frequency division clock DWCK as the selection clock SWCK when the phase selection signal PSEL set to have a first logic level is received. The selection clock generation circuit 244 may invert the frequency division clock DWCK to output the inverted frequency division clock as the selection clock SWCK when the phase selection signal PSEL set to have a second logic level is received. The selection clock generation circuit 244 may receive the phase selection signal PSEL set to have a first logic level in the test write operation to output the frequency division clock DWCK as the selection clock SWCK, and then, receive the phase selection signal PSEL set to have a second logic level and invert the frequency division clock DWCK to output the inverted frequency division clock as the selection clock SWCK.

The command pulse generation circuit 245 may receive the test write command WT_D from the command decoder 241, and receive the selection clock SWCK from the selection clock generation circuit 244. The command pulse generation circuit 245 may generate the command pulse CMDP in synchronization with the selection clock SWCK when the test write command WT_D is generated for the test write operation. The command pulse generation circuit 245 may generate the command pulse CMDP in synchronization with a rising edge of the selection clock SWCK when the test write command WT_D is generated and the frequency division clock DWCK is output as the selection clock SWCK by the phase selection signal PSEL set to have a first logic level, and then, generate the command pulse CMDP in synchronization with the rising edge of the selection clock SWCK when the frequency division clock DWCK is inverted and output as the selection clock SWCK by the phase selection signal PSEL set to have a second logic level.

The alignment data generation circuit 247 may receive the internal data IDQ from the data buffer 237, and receive the command pulse CMDP from the command pulse generation circuit 245. The alignment data generation circuit 247 may align the internal data IDQ, based on the command pulse CMDP to generate the alignment data ALD. The alignment data generation circuit 247 may align the internal data IDQ in an in-phase manner, based on the command pulse CMDP to generate the alignment data ALD when the command pulse CMDP is generated in synchronization with the selection clock SWCK generated from the frequency division clock DWCK by the phase selection signal PSEL, and align the internal data IDQ in an out-of-phase manner, based on the command pulse CMDP to generate the alignment data ALD when the command pulse CMDP is generated in synchronization with the selection clock SWCK generated by inverting the frequency division clock DWCK by the phase selection signal PSEL.

The phase detection circuit 249 may receive the alignment data ALD from the alignment data generation circuit 247. The phase detection circuit 249 may determine the synchronization states of the clock CLK and the frequency division clock DWCK, based on the phase selection signal PSEL and the alignment data ALD. More specifically, the phase detection circuit 249 may receive the alignment data ALD generated by aligning the internal data IDQ in an in-phase manner when the phase selection signal PSEL set to have a first logic level is received, and then, receive the alignment data ALD generated by aligning the internal data IDQ in an out-of-phase manner when the phase selection signal PSEL set to have a second logic level is received. In addition, the phase detection circuit 249 may determine the synchronization states of the clock CLK and the frequency division clock DWCK, based on the alignment data ALD received when the phase selection signal PSEL is at a first logic level and the alignment data ALD received when the phase selection signal PSEL is at a second logic level. As an example, when the alignment data ALD received when the phase selection signal PSEL is at a first logic level is set to be in-phase with the data pattern D_P and the alignment data ALD received when the phase selection signal PSEL is at a second logic level is not set to be out-of-phase with the data pattern D_P, the phase detection circuit 249 may determine that the clock CLK and the frequency division clock DWCK are synchronized in an in-phase manner. As another example, when the alignment data ALD received when the phase selection signal PSEL is at a first logic level is not set to be in-phase with the data pattern D_P and the alignment data ALD received when the phase selection signal PSEL is at a second logic level is set to be out-of-phase with the data pattern D_P, the phase detection circuit 249 may determine that the clock CLK and the frequency division clock DWCK are synchronized in an out-of-phase manner. As a further example, when the alignment data ALD received when the phase selection signal PSEL is at a first logic level is not set to be in-phase with the data pattern D_P and the alignment data ALD received when the phase selection signal PSEL is at a second logic level is not set to be out-of-phase with the data pattern D_P, the phase detection circuit 249 may determine that the clock CLK and the frequency division clock DWCK fail in synchronization. As a further example, when the alignment data ALD received when the phase selection signal PSEL is at a first logic level is set to be in-phase with the data pattern D_P and the alignment data ALD received when the phase selection signal PSEL is at a second logic level is set to be out-of-phase with the data pattern D_P, the phase detection circuit 249 may determine that the clock CLK and the frequency division clock DWCK fail in synchronization.

The semiconductor device 23B may be different from the semiconductor device 13 shown in FIG. 2, which performs the test write operation using the first data DQ1 and the second data DQ2, in that the semiconductor device 23B not only buffers one piece of data DQ to generate the internal data IDQ, but also aligns the one piece of data DQ in an in-phase and out-of-phase manner to generate the first alignment data ALD1 and the second alignment data ALD2. In addition, the semiconductor device 23B may be different from the semiconductor device 13 shown in FIG. 2 and the semiconductor device 23A shown in FIG. 9 in that the semiconductor device 23B includes the selection clock generation circuit 244 that generates the selection clock SWCK from the frequency division clock DWCK by the phase selection signal PSEL or generates the selection clock SWCK by inverting the frequency division clock DWCK. In addition, the semiconductor device 23B may be different from the semiconductor device 13 shown in FIG. 2 and the semiconductor device 23A shown in FIG. 9 in that the semiconductor device 23B includes the command pulse generation circuit 245 that generates the command pulse CMDP, based on the selection clock SWCK and the alignment data generation circuit 247 that generates the alignment data ALD by aligning the internal data IDQ, based on the command pulse CMDP.

Figure 11:
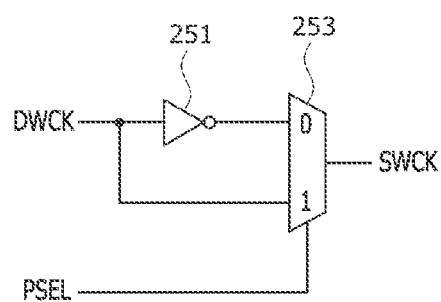
FIG. 11 is a diagram according to an embodiment of a selection clock generation circuit included in the semiconductor device of FIG. 10.

FIG. 11 is a diagram of a selection clock generation circuit 244A according to an embodiment of the selection clock generation circuit 244 shown in FIG. 10.

As shown in FIG. 11, the selection clock generation circuit 244A may include an inverter 251 and a selector 253. The inverter 251 may invert the frequency division clock DWCK to output the inverted frequency division clock. The selector 253 may receive the frequency division clock DWCK through an input terminal '1', and receive an output signal of the inverter 251 through an input terminal '0'. The selector 253 may select and output the frequency division clock DWCK received through the input terminal '1' as the selection clock SWCK when the phase selection signal PSEL of a logic "high" level is received to generate the alignment data ALD aligned in an in-phase manner in the test write operation. The selector 253 may select and output the output signal of the inverter 251 received through the input terminal '0' as the selection clock SWCK when the phase selection signal PSEL of a logic "low" level is received to generate the alignment data ALD aligned in an out-of-phase manner in the test write operation.

FIG. 12 is a table illustrating a test write operation of the semiconductor device 23B shown in FIG. 10.

As shown in FIG. 12, when the phase selection signal PSEL of a logic "high" level 'H' is received and the alignment data ALD aligned to be in-phase with the data pattern D_P is generated in a state where the data pattern D_P is set to have 4-bit logic bit set '1100', the clock CLK and the frequency division clock DWCK may be determined to be synchronized in an in-phase manner.

As shown in FIG. 12, when the phase selection signal PSEL of a logic "high" level 'H' is received and the alignment data ALD aligned to be out-of-phase with the data pattern D_P is generated in a state where the data pattern D_P is set to have the 4-bit logic bit set '1100', the clock CLK and the frequency division clock DWCK may be determined to be failed in synchronization.

As shown in FIG. 12, when the phase selection signal PSEL of a logic "low" level 'L' is received and the alignment data ALD aligned to be out-of-phase with the data pattern D_P is generated in a state where the data pattern D_P is set to have the 4-bit logic bit set '1100', the clock CLK and the frequency division clock DWCK may be determined to be synchronized in an out-of-phase manner.

As shown in FIG. 12, when the phase selection signal PSEL of a logic "low" level 'L' is received and the alignment data ALD aligned to be in-phase with the data pattern D_P is generated in a state where the data pattern D_P is set to have the 4-bit logic bit set '1100', the clock CLK and the frequency division clock DWCK may be determined to be failed in synchronization.

Figure 13:
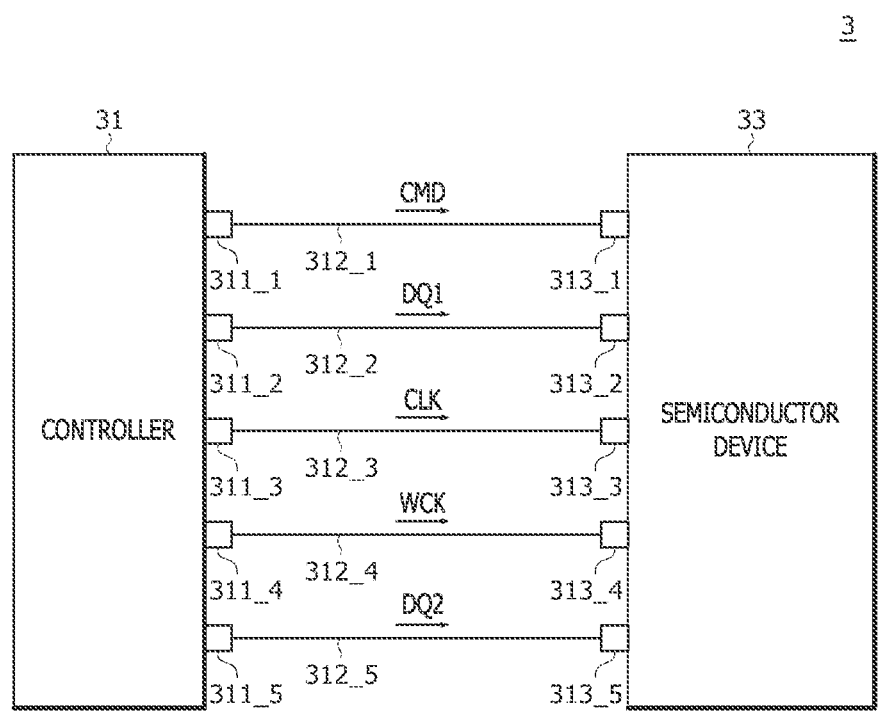
FIG. 13 is a block diagram illustrating a configuration of a semiconductor system according to a further embodiment of the present disclosure.
Figure 14:
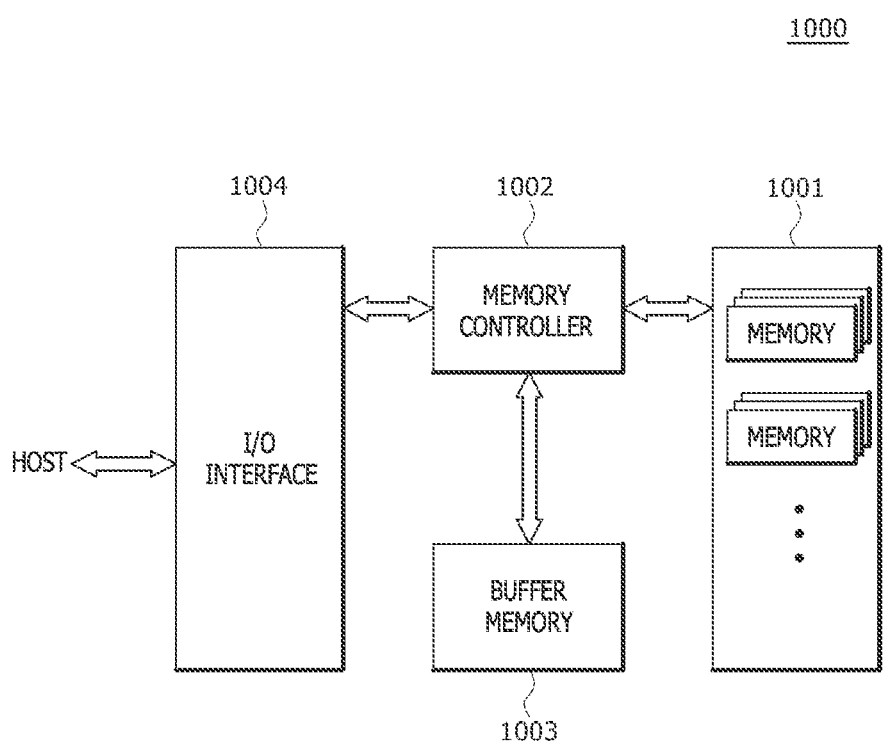
FIG. 14 is a block diagram illustrating a configuration of an electronic system according to an embodiment of the present disclosure.

FIG. 13 is a block diagram illustrating a configuration of a semiconductor system 3 according to an embodiment of the present disclosure. FIG. 14 is a block diagram illustrating a configuration of an electronic system 1000 according to an embodiment of the present disclosure. As shown in FIG. 13, the semiconductor system 3 may include a controller 31 and a semiconductor device 33.

The controller 31 may include a first control pin 311_1, a second control pin 311_2, a third control pin 311_3, a fourth control pin 311_4, and a fifth control pin 311_5. The semiconductor device 33 may include a first device pin 313_1, a second device pin 313_2, a third device pin 313_3, a fourth device pin 313_4, and a fifth device pin 313_5. The controller 31 may transmit a command CMD to the semiconductor device 33 through a first transmission line 312_1 connected between the first control pin 311_1 and the first device pin 313_1. The controller 31 may apply first data DQ1 to the semiconductor device 33 through a second transmission line 312_2 connected between the second control pin 311_2 and the second device pin 313_2. The first data DQ1 may be set to be the same as a data pattern D_P. The controller 31 may apply a clock CLK to the semiconductor device 33 through a third transmission line 312_3 connected between the third control pin 311_3 and the third device pin 313_3. The controller 31 may apply a data clock WCK to the semiconductor device 33 through a fourth transmission line 312_4 connected between the fourth control pin 311_4 and the fourth device pin 313_4. The controller 31 may apply second data DQ2 to the semiconductor device 33 through a fifth transmission line 312_5 connected between the fifth control pin 311_5 and the fifth device pin 313_5. The second data DQ2 may be set to be the same as the data pattern D_P.

The semiconductor device 33 may receive the command CMD, the first data DQ1, the second data DQ2, the system clock CLK, and the data clock WCK to perform a test write operation for determining whether the clock CLK and a frequency division clock DWCK are synchronized, thereby effectively determining whether the clock CLK and the frequency division clock DWCK are synchronized.

The semiconductor system 3 may be different from the semiconductor system 1 shown in FIG. 1, in that the pins 311_2, 313_2, 311_5, and 313_5 transmitting the first data DQ1 and the second data DQ2 are positioned symmetrically with respect to the pins 311_3, 313_3, 311_4, and 313_4 transmitting the clock CLK and the data clock WCK.

The previously described semiconductor device 13A of FIG. 2, the semiconductor device 23A of FIG. 9, and the semiconductor device 23B of FIG. 10 may be applied to an electronic system including a memory system, a graphic system, a computing system, and a mobile system. For example, referring to FIG. 14, the electronic system 1000 according to an embodiment of the present disclosure may include a data storage unit 1001, a memory controller 1002, a buffer memory device 1003, and an input/output (I/O) interface 1004.

The data storage unit 1001 may store data (not shown) applied from the memory controller 1002, and read out the stored data (not shown) to output the data to the memory controller 1002, according to a control signal from the memory controller 1002. Meanwhile, the data storage unit 1001 may include a non-volatile memory device capable of continuously storing data without loss even when power is cut off. The non-volatile memory device may be implemented with a flash memory (NOR flash memory, NAND flash memory) device, a phase change random-access memory (PRAM) device, a resistive random-access memory (RRAM) device, a spin transfer torque random-access memory (STTRAM) device, or a magnetic random-access memory (MRAM) device.

The memory controller 1002 may decode a command applied from an external device (host device) through the input/output interface 1004, and control data input/output for the data storage unit 1001 and the buffer memory device 1003 according to a decoding result. In FIG. 14, the memory controller 1002 is illustrated as one block, but a controller for controlling the data storage unit 1001 and a controller for controlling the buffer memory device 1003, which is a volatile memory device, may be configured independently. The memory controller 1002 may include the controller 11 described with reference to FIG. 1, the controller 21 described with reference to FIG. 8, and the controller 31 described with reference to FIG. 13.

The buffer memory device 1003 may temporarily store data to be processed by the memory controller 1002, that is, data (not illustrated) input and output to and from the data storage unit 1001. The buffer memory device 1003 may store data (not shown) applied from the memory controller 1002 according to a control signal. The buffer memory device 1003 may include the semiconductor device 13A described with reference to FIG. 2, the semiconductor device 23A described with reference to FIG. 9, and the semiconductor device 23B described with reference to FIG. 10. The buffer memory device 1003 may read out the stored data, and output the data to the memory controller 1002. The buffer memory device 1003 may include volatile memory devices such as a dynamic random-access memory (DRAM) device, a mobile DRAM device, a static random-access memory (SRAM) device, and the like.

The input/output interface 1004 may provide physical connection between the memory controller 1002 and an external device (host device) to allow the memory controller 1002 to receive a control signal for data input/output from the external device and to exchange data with the external device. The input/output interface 1004 may include one of a variety of interface protocols such as universal serial bus (USB), multi-media card (MMC), peripheral component interconnect-express (PCI-E), serial attached SCSI (SAS), advanced technology attachment (ATA), serial ATA (SATA), parallel ATA (PATA), small computer system interface (SCSI), enhanced small disk interface (ESDI), integrated drive electronics (IDE), and the like.

The electronic system 1000 may be used as an auxiliary memory device of a host device or an external storage device. The electronic system 1000 may include a solid state disk (SSD), a universal serial bus (USB) memory device, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF), and the like.

Figure 15:
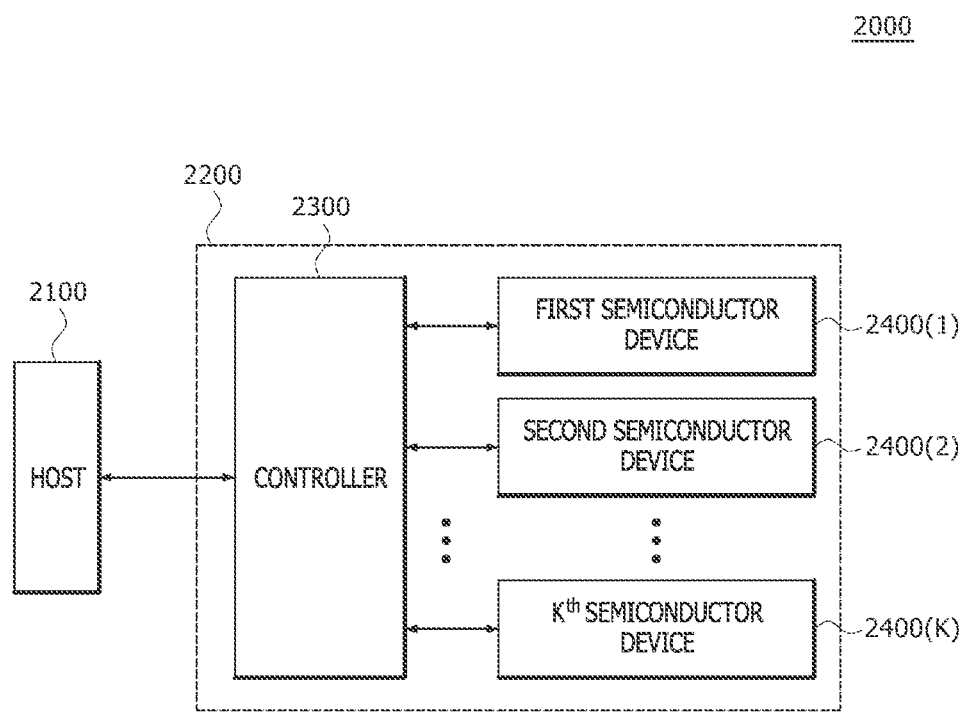
FIG. 15 is a block diagram illustrating a configuration of an electronic system according to another embodiment of the present disclosure.

FIG. 15 is a block diagram illustrating a configuration of an electronic system 2000 according to another embodiment of the present disclosure. As shown in FIG. 15, the electronic system 2000 may include a host 2100 and a semiconductor system 2200.

The host 2100 and the semiconductor system 2200 may transmit signals to each other using interface protocols. The interface protocols used between the host 2100 and the semiconductor system 2200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), serial attached SCSI (SAS), universal serial bus (USB), and the like.

The semiconductor system 2200 may include a controller 2300 and semiconductor devices 2400(1:K). The controller 2300 may apply a voltage code V_CD, a code input control signal CICNT, and a fuse selection address FS_ADD to each of the semiconductor devices 2400(1:K). Each of the semiconductor devices 2400(1:K) may perform a test write operation to effectively determine whether a clock CLK and a frequency division clock DWCK are synchronized.

The controller 2300 may include the controller 11 described above with reference to FIG. 1, the controller 21 described above with reference to FIG. 8, and the controller 31 described above with reference to FIG. 13. Each of the semiconductor devices 2400(1:K) may include the semiconductor device 13A described above with reference to FIG. 2, the semiconductor device 23A described above with reference to FIG. 9, and the semiconductor device 23B described above with reference to FIG. 10. Each of the semiconductor devices 2400(1:K) may be implemented with one of a dynamic random-access memory (DRAM) device, a phase change random-access memory (PRAM) device, a resistive random-access memory (RRAM) device, a magnetic random-access memory (MRAM) device, and ferroelectric random-access memory (FRAM) device.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A semiconductor device comprising:
   a command pulse generation circuit configured to generate a first command pulse in synchronization with a frequency division clock and to generate a second command pulse in synchronization with an inverted frequency division clock, based on a test write command;
   an alignment data generation circuit configured to align first internal data in an in-phase manner to generate first alignment data, based on the first command pulse, and to align second internal data in an out-of-phase manner to generate second alignment data, based on the second command pulse; and
   a phase detection circuit configured to determine synchronization states of a clock and the frequency division clock, based on the first alignment data and the second alignment data.

2. The semiconductor device of claim 1, further comprising a command decoder configured to sequentially generate a clock synchronization command and the test write command to perform a test write operation.

3. The semiconductor device of claim 1, further comprising a frequency division clock generation circuit configured to divide a frequency of the clock to generate the frequency division clock and the inverted frequency division clock.

4. The semiconductor device of claim 1, further comprising a data buffer configured to buffer first data generated to be the same as a data pattern to generate the first internal data, and to buffer second data generated to be the same as the data pattern to generate the second internal data.

5. The semiconductor device of claim 1, wherein the command pulse generation circuit includes:
   a first command pulse generation circuit configured to generate the first command pulse in synchronization with the frequency division clock when the test write command is generated; and
   a second command pulse generation circuit configured to generate the second command pulse in synchronization with the inverted frequency division clock when the test write command is generated.

6. The semiconductor device of claim 1, wherein the alignment data generation circuit includes:
   a first alignment data generation circuit configured to align the first internal data in an in-phase manner to generate the first alignment data when the first command pulse is generated; and
   a second alignment data generation circuit configured to align the second internal data in an out-of-phase manner to generate the second alignment data when the second command pulse is generated.

7. The semiconductor device of claim 1, wherein the phase detection circuit is configured to determine that the clock and the frequency division clock are synchronized in an in-phase manner when the first alignment data is set to be in-phase with a data pattern and the second alignment data is not set to be out-of-phase with the data pattern.

8. The semiconductor device of claim 1, wherein the phase detection circuit is configured to determine that the clock and the frequency division clock are synchronized in an out-of-phase manner when the first alignment data is not set to be in-phase with a data pattern and the second alignment data is set to be out-of-phase with the data pattern.

9. The semiconductor device of claim 1, wherein the phase detection circuit is configured to determine that the clock and the frequency division clock fail in synchronization when the first alignment data is set to be in-phase with a data pattern and the second alignment data is set to be out-of-phase with the data pattern.

10. The semiconductor device of claim 1, wherein the phase detection circuit is configured to determine that the clock and the frequency division clock fail in synchronization when the first alignment data is not set to be in-phase with a data pattern and the second alignment data is not set to be out-of-phase with the data pattern.

11. A semiconductor device comprising:
    a command pulse generation circuit configured to generate a first command pulse in synchronization with a frequency division clock, and to generate a second command pulse in synchronization with an inverted frequency division clock, based on a test write command;
    an alignment data generation circuit configured to align internal data in an in-phase manner to generate first alignment data, based on the first command pulse, and to align the internal data in an out-of-phase manner to generate second alignment data, based on the second command pulse; and
    a phase detection circuit configured to determine synchronization states of a clock and the frequency division clock, based on the first alignment data and the second alignment data.

12. The semiconductor device of claim 11, further comprising a data buffer configured to buffer data generated to be the same as a data pattern to generate the internal data.

13. The semiconductor device of claim 11, wherein the alignment data generation circuit includes:
a first alignment data generation circuit configured to align the internal data in an in-phase manner to generate the first alignment data when the first command pulse is generated; and
a second alignment data generation circuit configured to align the internal data in an out-of-phase manner to generate the second alignment data when the second command pulse is generated.

14. A semiconductor device comprising:
a selection clock generation circuit configured to generate a selection clock from a frequency division clock, based on a phase selection signal;
a command pulse generation circuit configured to generate a command pulse in synchronization with the selection clock, based on a test write command;
an alignment data generation circuit configured to align internal data to generate alignment data, based on the command pulse; and
a phase detection circuit configured to determine synchronization states of a clock and the frequency division clock, based on the phase selection signal and the alignment data.

15. The semiconductor device of claim 14,
wherein the selection clock generation circuit is configured to receive the phase selection signal, and
wherein the phase selection signal is set to have a first logic level to generate the alignment data aligned in an in-phase manner in a test write operation, and is set to have a second logic level to generate the alignment data aligned in an out-of-phase manner in the test write operation.

16. The semiconductor device of claim 14, wherein the selection clock generation circuit is configured to output the frequency division clock as the selection clock, based on the phase selection signal in a test write operation, and to invert the frequency division clock to output an inverted frequency division clock as the selection clock, based on the phase selection signal in the test write operation.

17. The semiconductor device of claim 14, wherein the command pulse generation circuit is configured to:
generate the command pulse in synchronization with the selection clock when the frequency division clock is output as the selection clock, and
generate the command pulse in synchronization with the selection clock when the frequency division clock is inverted to be output as the selection clock, when the test write command is generated for the test write operation.

18. The semiconductor device of claim 14, wherein the alignment data generation circuit is configured to:
align the internal data in an in-phase manner to generate the alignment data, based on the command pulse when the command pulse is generated in synchronization with the selection clock generated from the frequency division clock; and
align the internal data in an out-of-phase manner to generate the alignment data, based on the command pulse when the command pulse is generated in synchronization with the selection clock generated by inverting the frequency division clock.

19. A semiconductor system comprising:
a controller configured to apply a command, a clock, a data clock, first data, and second data; and
a semiconductor device configured to sequentially generate a clock synchronization command and a test write command, based on the command for performing a test write operation, to divide a frequency of the data clock to generate a frequency division clock and an inverted frequency division clock, to align first internal data and second internal data generated by buffering the first data and the second data to generate first alignment data and second align data, based on a first command pulse and a second command pulse generated in synchronization with the frequency division clock and the inverted frequency division clock, and to determine synchronization states of the clock and the frequency division clock, based on the first alignment data and the second align data.

20. A semiconductor system comprising:
a controller configured to apply a command, a clock, a data clock, and data; and
a semiconductor device configured to sequentially generate a clock synchronization command and a test write command, based on the command for performing a test write operation, to divide a frequency of the data clock to generate a frequency division clock and an inverted frequency division clock, to align internal data generated by buffering the data to generate first alignment data and second align data, based on a first command pulse and a second command pulse generated in synchronization with the frequency division clock and the inverted frequency division clock, and to determine synchronization states of the clock and the frequency division clock, based on the first alignment data and the second alignment data.

21. A semiconductor system comprising:
a controller configured to apply a command, a clock, a data clock, and data; and
a semiconductor device configured to sequentially generate a clock synchronization command and a test write command, based on the command for performing a test write operation, to divide a frequency of the data clock to generate a frequency division clock, to output the frequency division clock or an inverted frequency division clock as a selection clock, based on a phase selection signal, to align internal data generated by buffering the data to generate alignment data, based on a command pulse generated in synchronization with the selection clock, and to determine synchronization states of the clock and the frequency division clock, based on the phase selection signal and the alignment data.

* * * * *